United States Patent [19]

Kaizer et al.

[11] Patent Number: 4,709,391

[45] Date of Patent: Nov. 24, 1987

[54] ARRANGEMENT FOR CONVERTING AN ELECTRIC SIGNAL INTO AN ACOUSTIC SIGNAL OR VICE VERSA AND A NON-LINEAR NETWORK FOR USE IN THE ARRANGEMENT

[75] Inventors: Adrianus J. M. Kaizer, Eindhoven; Gerrit H. Van Leeuwen, Heerlen, both of Netherlands

[73] Assignee: U.S. Philips Corporation, New York, N.Y.

[21] Appl. No.: 739,579

[22] Filed: May 30, 1985

[30] Foreign Application Priority Data

Jun. 8, 1984 [NL] Netherlands ........................ 8401823

[51] Int. Cl.[4] ........................ H03G 5/00

[52] U.S. Cl. ........................ 381/98; 381/96

[58] Field of Search ........................ 381/96, 98, 103, 59

[56] References Cited

U.S. PATENT DOCUMENTS 3,988,541 10/1976 Boast ........................ 381/98

4,113,983 9/1978 Steel ........................ 381/98

4,340,778 7/1982 Cowans et al. ........................ 381/98

*Primary Examiner*—Forester W. Isen

*Attorney, Agent, or Firm*—Thomas A. Briody; Jack Oisher; William J. Streeter

[57] ABSTRACT

An arrangement for converting an electric signal into an acoustic signal (y/t) or vice versa, comprises an electroacoustic transducer (2) and means (3) for reducing distortion in the output signal of the arrangement, which distortion is caused by the electroacoustic or acoustoelectric conversion performed by the transducer.

The means comprise a non-linear network (3', 3" or 3''' in FIGS. 3; 43', 43" or 43''' in FIG. 4). The non-linear network is arranged for reducing non-linear distortion by compensating for at least a second or higher order distortion component in the output signal of the arrangement. The network may comprise at least two parallel circuit branches (15*a*, 15*b* in FIG. 3; 47*a*, 47*b* in FIG. 4). At least one of the circuit branches (15*b* in FIG. 3; 47*b* in FIG. 4) compensates for non-linear distortion of the second or higher order.

12 Claims, 15 Drawing Figures

ARRANGEMENT FOR CONVERTING AN ELECTRIC SIGNAL INTO AN ACOUSTIC SIGNAL OR VICE VERSA AND A NON-LINEAR NETWORK FOR USE IN THE ARRANGEMENT

The invention relates to an arrangement for converting an electric signal into an acoustic signal or vice versa, comprising an electroacoustic transducer and means for reducing distortion in the output signal of the arrangement, the distortion being caused by the electro-acoustic or acoustoelectric conversion, respectively, performed by the transducer.

The invention also relates to a non-linear network for use in an arrangement according to the invention.

An arrangement of the type specified in the opening paragraph is disclosed in United Kingdom Patent Specification No. 1,031,145 (PH 18.481), which describes an arrangement for converting an electric signal into an acoustic signal. The patent specification describes an arrangement in which, by using negative feedback, the distortion produced by a loudspeaker can be reduced. For that purpose a signal is obtained which is representative of the linear behaviour and the non-linear behaviour of the loudspeaker. Thus a signal can be obtained from a pick-up provided on a moving portion, for example the diaphragm, of the loudspeaker. If this signal is fed back adequately to the input of the loudspeaker, then a reduction in the non-linear distortion is inter alia obtained. Using negative feedback has the advantage that it is not necessary to know the exact nature of the non-linearity and that the system also remains operative when the non-linearity changes. However using negative feedback also has drawbacks:

a. the system may become unstable.
b. In the event of excessive negative feedback microphonics become troublesome. This limits the level of the feedback.
c. If an element of the feedback circuit clips, for example the amplifier, the loudspeaker or the active filters, then the consequences in a circuit having a high feedback level are serious. Additional provisions must then be made, such as for example the use of limiters to prevent clipping from occurring.

The invention has for its object to provide an arrangement which can be inherently stable and capable of significantly reducing the non-linear distortion produced by the transducer (in the form of a loudspeaker or a microphone) and, if so desired, also the linear distortion produced by the transducer. According to the invention, the arrangement is therefore characterized in that the means comprise a non-linear network coupled to the transducer, which network is arranged for reducing non-linear distortion by compensating for at least one second or higher-order distortion component in the output signal of the arrangement. The invention is based on the recognition that there is an alternative way to compensate for the non-linear distortion produced by the transducer, namely by the use of a non-linear network. The behaviour of the transducer, non-linearities included, can be described by means of a functional series expansion, a so-called Volterra array (Schetzen). Let it be assumed that the transducer behaves as a time-invariant system and that the non-linearities are comparatively small, so that the array converges. It is indeed true that the dominant non-linearities occurring in a transducer in the form of an electro-dynamic transducer, such as the finite magnetic field in the air gap, the position-dependent inductance of the voice coil and the non-linearity of the suspension are substantially time-invariant and comparatively small. The Volterra array of a general non-linear system has the following form:

$$y(t) = \int_0^\infty h_1(\tau)H(t-\tau)d\tau + \int_0^\infty \int_0^\infty h_2(\tau_1,\tau_2)H(t-\tau_1)H(t-\tau_2)d\tau_1 d\tau_2 + \int_0^\infty \int_0^\infty \int_0^\infty h_3(\tau_1,\tau_2,\tau_3)H(t-\tau_1)H(t-\tau_2)H(t-\tau_3).$$

$$d\tau_1 d\tau_2 d\tau_3 + + \ldots \text{ etcetera.}$$

Herein x(t) is the input signal of the system, $h_1(t)$ the pulse response of the linear portion of the system, that is to say the response of the system to a pulse-shaped input signal, $h_2(t_1, t_2)$ is the second-order response of the system to an input signal made up from two pulses which are time-shifted relative to each other, and $h_3(t_1, t_2, t_3)$ is the third-order response of the system to an input signal made up from three pulses which are time-shifted relative to each other.

A frequency-domain description is alternatively possible and is defined as follows:

$$Y(p) = H_1(p).X(p) + A\{H_2(p_1, p_2).X(p_1).X(p_2)\} + + A^2\{H_3(p_1, p_2, p_3).X(p_1).X(p_2).X(p_3)\} + \quad (2)$$

wherein $H_i$ is the multi-dimensional Laplace transform of $h_i$ from formula (1), A and $A^2$ are the what are commonly called contraction operators (Schetzen and Butterweck) and $H_1$ is the linear transfer function. The last description is very convenient when considering the principle of distortion reduction with the aid of a non-linear network.

In the Laplace transform a signal is transferred from the time domain, which has the variable t (being the time) as a running variable, to the p-domain, having the variable p as a running variable. The variable p is a complex quantity equal to $\alpha + j\omega$, wherein a is a constant and $\omega$ is an angular frequency ($\omega = 2\pi f$). For $a=0$ the Laplace transform becomes the (better known) Fourier transform. In addition it should be noted that $H_1(p)$, $H_2(p_1, p_2)$, . . . etc. are complex functions of the frequency.

In a practical situation it is impossible to implement all the Volterra terms in one circuit. Therefore, the Volterra array is truncted at a predetermined term, for example the third order term. This results in that only the distortion products up to and including the third order are included. To demonstrate all this and to keep the formula small, there now follows an example of a quadratic system; the terms of a higher order are not included.

$$Y(p) = H_1(p).X(p) + A\{H_2(p_1, p_2).X(p_1).X(p_2)\} \quad (3)$$

The inverse function is again a Volterra array which is truncated after the second term. If it is assumed that $$X(p) = G_1(p).Y(p) + A\{G_2(p_1, p_2).Y(p_1).Y(p_2)\} \quad (4)$$

and thereafter formula (4) is introduced into formula (3), then if it is a requirement for the terms up to and inclusive of the second order to achieve compensation, it is found that:

$$G_1(p)=1/H_1(p) \quad (5)$$

$$G_2(p_1, p_2)=-H_2(p_1, p_2)/\{H_1(p_1+p_2).H_1(p_1).H_1(p_2)] \quad (6)$$

In the derivation use is made of the fact that function, for example $H_1(p)$, can be placed behind the contraction operator A as follows:

$$H_1(p)A\{\ldots\}=A\{H_1(p_1+p_2)\ldots\}$$

From the foregoing it follows that the first term $G_1(p)$ is required to be exactly the inverse of the transfer function term $H_1(p)$ describing the linear portion of the transfer of the transducer. In addition, it will be obvious that both first order distortion—being the linear distortion due to the fact that in general $H_1(p)$ is not constant as a function of the frequency—and the second order distortion which produces a plurality of non-linear distortion components, can be suppressed by arranging a non-linear network in series with the transducer. When the transducer is a loudspeaker, then the non-linear network will be arranged between an input terminal of the arrangement and an input of the loudspeaker, and when the transducer is a microphone then the non-linear network will be arranged between an output of the microphone and an output terminal of the arrangement. Here it should already be noted that only in the event that both the non-linear and the linear distortions are suppressed are the formulae for $G_1(p)$, $G_2(p_1, p_2)$ and $G_3(p_1, p_2, p_3)$ the same when applied to the suppression of distortion in both loudspeakers and microphones. The formulae applicable when suppressing only non-linear distortion, such as will be derived hereinafter, are not the same when used for loudspeakers—namely $KL_2$, $KL_3$, see formulae (12a) and (13a)—as those used for microphones—namely $Km_2$ and $Km_3$, see formulae (12c) and (13c).

An arrangement according to the invention may be additionally characterized in that the network is also arranged for reducing linear distortion by compensating for first order distortion, that to that end the network comprises at least two circuit branches in parallel, one circuit branch compensating for the first order distortion and having a transfer function $G_1(p)$ at least approximately corresponding to the inverse of the linear transfer function $H_1(p)$ of the transducer, multiplied by a constant $\alpha$, or $G_1(p)=\alpha/H_1(p)$ the other circuit branch compensated for the higher order distortion. So in this case both the first order distortion (being the above-mentioned linear distortion due to the fact that the linear transfer function $H_1(p)$ of the transducer is not flat, which means that $G_1(p)=1/H_1(p)$, see formula (5), if $\alpha$ is chosen equal to 1) and a higher order distortion are compensated for.

Such an arrangement may further be characterized in that the higher order distortion is the second order distortion and that the transfer function $G_2(p_1, p_2)$ of the other circuit branch is defined at least approximately by the equation:

$$G_2(p_1, p_2)=-\alpha H_2(p_1, p_2)/[H_1(p_1+p_2).H_1(p_1).H_1(p_2)],$$

wherein $H_2(p_1, p_2)$ is the Laplace transform of $h_2(t_1, t_2)$, being the second order response of the transducer to an input signal applied to the transducer, which signal is made up from two pulses which are time-shifted relative to each other. In that case the second order distortion in the non-linear distortion is compensated for. It will be obvious that $G_2(p_1, p_2)$ is defined by the formula (6) if $\alpha$ is chosen equal to 1. The arrangement may alternatively be further characterized in that the higher order distortion is the third order distortion and that the transfer function $G_3(p_1, p_2, p_3)$ of the other circuit branch is at least approximately defined by the equation:

$$G_3(p_1, p_2, p_3)=-\alpha H_3(p_1, p_2, p_3)/[H_1(p_1).H_1(p_2).H_1(p_3).H_1(p_1+p_2+P_3)], \quad (7)$$

wherein $H_3(p_1, p_2, p_3)$ is the Laplace transform of $h_3(t_1, t_2, t_3)$ being the third order response of the transducer to an input signal applied to the transducer, which signal is made up from three pulses which are time-shifted relative to each other. Now the third order distortion in the non-linear distortion is compensated for. The formula for $G_3(p_1, p_2, p_3)$ might have been derived by in the preceding example, also including the third order terms in formula (4) and inserting this (extended) formula (4) into formula (2). By requiring in the equation then obtained, that also the third order terms are compensated for, the above formula for $G_3(p_1, p_2, p_3)$ is obtained. It is evident that the system may be extended by including fourth and higher order terms.

An arrangement for converting an electric signal into an acoustic signal for which $G_2(p_1, p_2)$ is defined by formula (6), may further be characterized in that the other circuit comprises an integrating element an output of which is coupled to an input of a first circuit having a transfer characteristic which is at least approximately equal to unity divided by the transfer function of the input current of the transducer to the excursion of the transducer diaphragm, and also coupled to an input of a first squaring circuit and to a first input of a multiplier, that the output of the first circuit is coupled to an input of a second squaring circuit and to a second input of the multiplier, and that the outputs of the first and second squaring circuits and of the multiplier are coupled via associated first, second and third amplifier stages to respective first, second and third input of a signal combining unit. In this way the second order distortion component produced by a current-controlled loudspeaker can be compensated for.

An arrangement additionally characterized as set forth has the disadvantage that to compensate for the linear distortion the implementation of the inverse function—namely $G_1(p)=1/h_1(p)$—is physically not always possible, although it will usually be successful in a limited frequency range. If, however, one wants to implement the inverse function $G_1(p)$ for a frequency range from 0 Hz to, for example, 20 kHz then this will meet with no success since the transfer function $H_1(p)$ has zero points at 0 Hz and at very high frequencies (or become very small there). As a result of this it is only possible to realize an approximation for the transfer function $1/H_1(p)$. And since the function $1/H_1$ also occurs in the higher order transfer functions $G_2(p_1, p_2)$ and $G_3(p_1, p_2, p_3)$, it is also for these transfer functions only possible to realize an approximation so that the distortion-suppressing action of such an arrangement is not really optimal.

An arrangement according to the invention may, as an alternative, be additionally characterized in that the network is arranged for reducing only the non-linear distortion by compensating for at least second or higher order distortion produced by the transducer. An improved suppression of the non-linear distortion can be realized by constructing the network to be such that only one or more orders in the non-linear distortion are compensated for and not the linear distortion. The following derivation is effected on the basis of an arrangement for converting an electric signal into an acoustic signal. A similar derivation for an arrangement comprising a microphone furnishes different results as will become apparent hereinafter.

If it is assumed that x(t) and z(t) are the signals at the input and the output respectively of the network and y(t) is the acoustic output signal of the transducer, then it can be written analogously to equation (4) that:

$$Y(p)=H_1(p).Z(p)+A\{H_2(p_1, p_2).Z(p_1).Z(p_2)\} \quad (8)$$

The desired transfer is equal to $$Y(p)=H_1(p).X(p) \quad (9)$$

Let it now be assumed, analogous to formula (4), that $$Z(p)=K_1(p).X(p)+A\{K_{L2}(p_1, p_2)X(p_1)X(p_2)\} \quad (10)$$

By introducing formula (10) into formula (8) it is found, similar to the calculation using the formulae (3) and (4), that $$K_1(p)=1 \quad (11)$$

$$KL_2(p_1, p_2)=-H_2(p_1, p_2)/H_1(p_1+p_2) \quad (12a)$$

By also including the third order term in the systems description it is furthermore possible to derive that $$KL_3(p_1, p_2, p_3)=-H_3(p_1, p_2, p_3)/H_1(p_1+p_2+p_3) \quad (13a)$$

The formulae (12a) and (13a) show that $H_1(p)$ is present in the numerator, so that also here the zero points in $H_1(p)$ are a limiting factor, but an improvement has nevertheless occurred compared to the formulae (6) and (7) as there $H_1(p)$ occurs up to the third and fourth powers respectively. So the formulae (6) and (7) are more difficult to realize for larger frequency ranges.

Publications often describe efforts to compensate for the non-linearity by means of an instantaneous non-linearity, for example by having a quadratic system preceded by a root-extracting network. With such an instantaneous non-linearity the Volterra array changes into a power series. Generally, and definitely with an electroacoustical transducer, these techniques are not successful since the non-linearity acts as a non zero memory system. This means that the non-linearity is frequency-dependent or dispersive (Schetzen, Butterweck).

An arrangement additionally characterized according to the said alternative may be further characterized in that the network comprises at least two circuit branches in parallel one circuit branch having a transfer function $K_1(p)$ which is equal to a constant $\alpha$, the second circuit branch compensating for the second or higher order distortion. In this case there is no compensation for the linear distortion (that is to say the transfer function $H_1(p)$) of the transducer, see also formula (9).

With an arrangement further characterized according to the said alternative account should be taken of the fact, as already mentioned in the foregoing, that when the transducer is a loudspeaker, other transfer functions are obtained for the second and higher order distortions in the second circuit branch then when the transducer is a microphone.

When the arrangement is for converting an electric signal into an acoustic signal it may therefore be further characterized in that the second circuit branch compensates for the second order distortion and that the transfer function $KL_2(p_1, p_2)$ of the second circuit branch is, at least approximately, defined by the equation $$KL_2(p_1, p_2)=-\alpha H_2(p_1, p_2)/H_1(p_1+p_2), \quad (12b)$$

wherein $H_1(p)$ is the linear transfer function of the transducer and $H_2(p_1, p_2)$ is the Laplace transform of $H_2(t_1, t_2)$, being the second order response of the transducer to an input signal applied to the transducer, which signal is made up from two pulses which are time-shifted relative to each other. In that case the second order distortion in the non-linear distortion in the acoustic output signal of the loudspeaker is compensated for. It will be obvious that $KL_2(p_1, p_2)$ is defined by the formula (12a), the factor $\alpha$ excepted.

When the arrangement is for converting an electric signal into an acoustic signal it may alternatively be characterized in that the second circuit branch compensates for the third order distortion and that the transfer function $KL_3(p_1, p_2, p_3)$ of the second circuit branch is, at least approximately, defined by the equation $$KL_3(p_1, p_2, p_3)=-\alpha H_3(p_1, p_2, p_3)/H_1(p_1+p_2+p_3), \quad (13b)$$

wherein $H_3(p_1, p_2, p_3)$ is the Laplace transform of $h_3(t_1, t_2, t_3)$, being the third order response of the transducer to an input signal applied to the tranducer, which signal is made up from three pulses which are time-shifted relative to each other. In that case the third order distortion in the non-linear distortion in the acoustic signal from the loudspeaker is compensated for. The formula for $KL_3(p_1, p_2, p_3)$ corresponds for $\alpha=1$ to formula (13a).

An arrangement according to the invention characterized in that $KL_2(p_1, p_2)$ is defined by formula (12b), may further be characterized in that the second circuit branch comprises a first circuit having a transfer function which is, at least approximately, equal to the transfer function of the transducer from an input voltage to the excursion of the transducer diaphragm, an output of which circuit is coupled to an input of a first squaring circuit and also via a first differentiating network to an input of a second squaring circuit, that an output of the second squaring circuit is coupled to a first input of a signal combining unit via a first amplifier stage and to a second input of a signal combining unit via a second differentiating network and a second amplifier stage, that an output of the first squaring circuit is coupled to a third input of the signal combining unit via a third amplifier stage and also to an input of a third differentiating network the output of which is coupled to a fourth input of the signal combining unit via a fourth amplifier stage and also to an input of a fourth differentiating network, that an output of the fourth differentiating network is coupled to a fifth input of the signal combining unit via a fifth amplifier stage and also to a sixth input of the signal combining unit via a fifth differentiating element and a sixth amplifier stage. In this way the second order distortion produced by an electrodynamic loudspeaker can be compensated for, in the event that this loudspeaker is driven with a constant voltage.

A similar circuit may alternatively be derived for the case in which the loudspeaker is driven with a constant current. This has the advantage that the voice coil inductance contributes only to a small extent to the distortion.

Such an arrangement may therefor be characterized, in that the second circuit branch comprises a first circuit having a transfer function which is at least approximately equal to the transfer function of the transducer input current to the excursion of the transducer diaphragm, an input of which circuit is coupled to an input of a first squaring circuit and to a first input of a multiplier and an output of which circuit is coupled to an input of a second squaring circuit and to a second input of the multiplier, that the outputs of the first and second squaring circuits and of the multiplier are coupled via associated first, second and third amplifier stages to respective first, second and third inputs of a signal combining unit. Such an arrangement is much easier to implement, inter alia because of the fact that the arrangement does not comprise differentiating networks.

When the arrangement is for converting an acoustic signal into an electric signal it may be further characterized in that the second circuit branch compensates for the second order distortion and that the transfer function $Km_2(p_1, p_2)$ of the second circuit branch is, at least approximately, defined by the equation $$Km_2(p_1,p_2) = -\alpha H_2(p_1, p_2)/H_1(p_2).H_1(p_2), \quad (12c)$$

wherein $H_1(p)$ is the linear transfer function of the transducer and $H_2(p_1, p_2)$ is the Laplace transform of $h_2(t_1, t_2)$, being the second order response of the transducer to an input signal applied to the transducer, which signal is made up from two pulses which are time-shifted relative to each other. Thus the second order distortion produced by acoustoelectric conversion in a microphone can be compensated for. This arrangement may alternatively be characterized in that the second circuit branch compensates for the third order distortion and that the transfer function $Km_3(p_1, p_2, p_3)$ of the second circuit branch is, at least approximately, defined by the equation $$Km_3(p_1, p_2, p_3) = -\alpha H_3(p_1, p_2, p_3)/H_1(p_1).H_1(p_2).H_1(p_3) \quad (13c)$$

wherein $H_1(p)$ is the linear transfer function of the transducer and $H_3(p_1, p_2, p_3)$ the Laplace transform of $h_3(t_1, t_2, t_3)$, being the third order response of the transducer to an input signal which is made up from pulses which are time-shifted relative to each other. In this way the third order distortion produced by acousto-electric conversion in a microphone can be compensated for.

The above-mentioned formula (11)—which in itself also holds only for the suppression of non-linear distortion in loudspeakers—and also the formulae (12c) and (13c) can be obtained using a similar method of calculation as that used for the suppression of only non-linear distortion with loudspeakers—formulae (8) to (10)—the difference being that the formulae (8) and (10) change into $$Z(p) = H_1(p).X(p) + A\{H_2(p_1, p_2).X(p_1).X(p_2)\}$$

$$Y(p) = K_1(p).Z(p) + A\{K_2(p_1, p_2).Z(p_1).Z(p_2)\}$$

because of the fact that here the non-linear network is arranged in the output from the microphone and not in the input thereto as is the case with the loudspeakers.

So when the arrangement comprises a non-linear network which only compensates for non-linear distortion, these two usages (namely with microphones and loudspeakers) yield different results. This in contrast to the arrangement comprising a non-linear network which suppresses both the linear distortion and the non-linear distortion, for which the results are equal, both when used with microphones and with loudspeakers.

Also for those arrangements in which only one or more orders of distortion in the non-linear distortion produced by the transducer is compensated for in the non-linear network there is a possibility of compensating, in addition, for the linear distortion produced by the transducer, more specifically because of the fact that an additional network may be arranged in cascade with the transducer, which additional network has a transfer function T(p) at least approximately equal to the inverse of the linear transfer function $H_1(p)$ of the transducer, or $T(p) = \beta/H_1(p)$, $\beta$ being a constant preferably equal to 1. The value for $\alpha$ is preferably chosen equal to 1.

A non-linear network according to the invention is characterized in that the network is arranged for reducing non-linear distortion by compensating for at least a second or higher order distortion in the output signal of the arrangement and caused by the electroacoustic conversion and the acoustoelectric conversion, respectively of the transducer.

The invention will now be described in greater detail by way of example with reference to the accompanying drawings.

DESCRIPTION OF THE PREFERRED EMBODIMENT

Figure 1A:
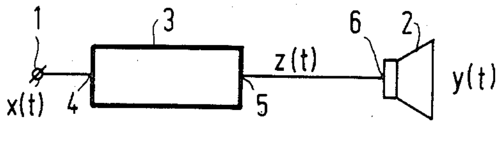
FIG. 1 shows in FIGS. 1*a* and 1*b* schematical representations of two embodiments of the invention.

FIG. 1*a* of FIG. 1 shows schematically an embodiment of the invention, having an input terminal 1 for receiving an electric signal x(t), an electroacoustic transducer 2 in the form of a loudspeaker, and a non-linear network 3 having an input 4 coupled to the input terminal 1 and an output 5 coupled to the input 6 of the transducer. The non-linear network 3 is arranged for reducing non-linear distortion in the acoustic signal y(t) resulting from the electroacoustic conversion of the transducer 2. The non-linear network 3 compensates for at least one second or higher order distortion component in the acoustic signal.

Figure 1B:
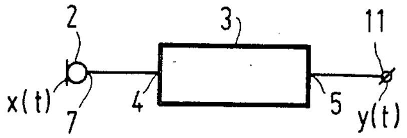

FIG. 1*b* shows schematically an embodiment of the invention comprising an electroacoustic transducer 2 in the form of a microphone, a non-linear network 3 having an input 4 coupled to the output 7 of the transducer 2 and an output 5 coupled to an output terminal 11 of the arrangement for producing an electric output signal y(t). The non-linear network 3 is arranged for reducing non-linear distortion in the output signal y(t) of the arrangement which distortion is caused by the acoustoelectric conversion by the transducer 2. The non-linear network 3 compensates for at least one second or higher order distortion in the output signal y(t).

Figure 2:
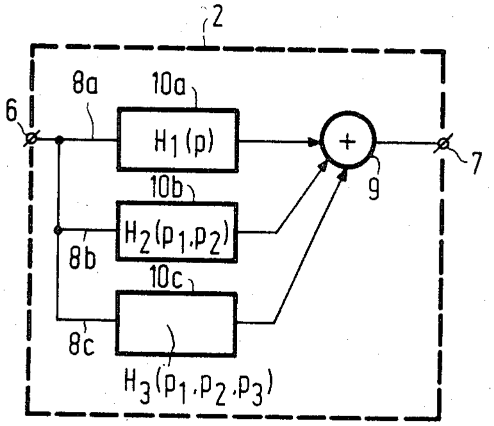
FIG. 2 shows a systems description of an electroacoustic transducer.

First the behaviour of the transducer 2 will be described in greater detail with reference to FIG. 2. This description will be made with reference to a transducer in the form of a loudspeaker. However, exactly the same holds for a transducer in the form of a microphone. The electric input of the transducer 2 is denoted in FIG. 2 by reference numeral 6 and the (acoustic) output of the transducer by reference numeral 7. The acoustic output signal y(t) of the transducer is available at this output. In a systems description of the transducer 2 the transducer is assumed to be replaced by a number of circuit arrangements 8*a*, 8*b*, 8*c* etc. in parallel, which have one end coupled to the input 6 and the other end to the output 7 via a signal combining unit 9, for example an adder. Each of the circuit arrangements comprises a circuit, 10*a*, 10*b*, 10*c* etc., having the respective transfer functions $H_1(p)$, $H_2(p_1, p_2)$, $H_3(p_1, p_2, p_3)$, . . . . $H_1(p)$ is the first order term in the transfer function of the transducer 2, see formula (2), and describes the linear transfer of the transducer. This implies that if a (sinusoidal) input signal having a given frequency p is applied to the input of the circuit 10*a* a sinusoidal signal having the same frequency p but possibly a different amplitude and phase appears at the output thereof. Generally the transfer function $H_1(p)$ of the circuit is not constant for all frequencies p; note, for example, the 12 dB/octave low-frequency decay of loudspeakers from the resonant frequency of the loudspeaker to lower frequencies. Therefore in this case the terms first order distortion or linear distortion are used.

$H_2(p_1, p_2)$ is the second order term in the transfer function of the transducer 2, see formula (2), and describes the non-linear second order distortion produced by the transducer. This implies that if two sinusoidal signals having frequencies $p_1$ and $p_2$, respectively, are applied to the input of the circuit 10*b* a signal comprising the following frequency components: $2p_1$, $2p_2$, $p_1+p_2$, $p_1-p_2$ (if $p_1>p$) appears at the output thereof. Therefore, this is called second order distortion, being the first component in the non-linear distortion. The result thereof is, for example, the second harmonic distortion components $2p_1$ and $2p_2$ respectively and the second order intermodulation distortion components $p_1+p_2$ and $p_1-p_2$ respectively.

$H_3(p_1, p_2, p_3)$ is the third order term in the transfer function of the transducer 2, see formula (2), and consequently describes third order distortion. This implies that if three sinusoidal signals having frequencies $p_1$, $p_2$, and $p_3$ are applied to the input of the circuit 10*c* a signal comprising the following frequency components: $3p_1$, $3p_2$, $3p_3$, $2p_1+p_2$, $2p_1+p_3$, $2p_2+p_1$, $2p_2p_3$, $2p_3+p_1$, $2p_3+p_2$, $p_1+p_2+p_3$, $p_1+p_2-p_3$, $p_1-p_2+p_3$ appears at the output thereof (it being assumed that $p_1>p_2>p_3$ and $p_1>p_2+p_3$). So here we have third order harmonic distortion, namely the terms $3p_1$, $3p_2$, $3p_3$, and third order intermodulation distortion, namely the remaining terms. See also Bruel and Kjaer Application Note 15-098. The system description in FIG. 2 for the loudspeaker 2 may of course be optionally extended by more circuits for describing distortion of a still higher order.

So as to compensate for the distortion components of the transducer 2, the network 3 is arranged in cascade with the transducer. Should this network 3 have a transfer function which is the inverse of the transfer function of the transducer 2 then the total transfer of the input signal x(t) to the output signal y(t) would be free from distortion.

For the linear distortion owing to $H_1(p)$, this is a technique known from the United Kingdom Patent Specification No. 1,031,145 which can be described as follows (the calculation will again be explained with reference to the loudspeaker shown in FIG. 1*a*):

$$Y(p)=H_1(p).Z(p) \tag{14}$$

$$Z(p)=G(p).X(p) \tag{15}$$

wherein X(p), Y(p) and Z(p) are the LaPlace transforms of x(t), y(t) and z(t), z(t) being the output signal of the network 3, and G(p) being the transfer function of network 3.

If G(p) is chosen equal to the inverse of $H_1(p)$ or $G(p)=1/H_1(p)$ then the formulae (14) and (15) result in Y(p)=X(p). This means that the input signal appears without distortion at the output.

The arrangement according to the invention comprises a non-linear network 3 of which three examples are shown in FIG. 3, which examples are suitable for use in both the arrangement shown in FIG. 1*a* and the arrangement shown in FIG. 1*b*.

Figure 3A:
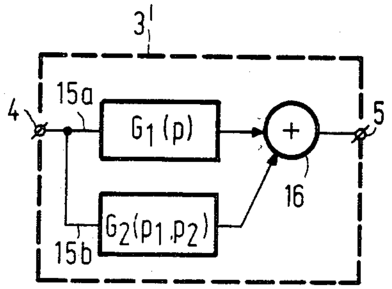
FIG. 3 illustrates by means of FIGS. 3*a*, 3*b* and 3*c* three possible constructions for a non-linear network according to the invention intended for additionally compensating for the linear distortion produced by the transducer.

FIG. 3*a* shows a non-linear network 3' comprising two circuit branches 15*a*, 15*b* in parallel, which branches are coupled to the input 4 and whose outputs are coupled to the output 5 of the network 3' via a signal combining unit 16. One circuit branch 15*a* compensates for the first order distortion produced by the transducer 2 and has a transfer function $G_1(p)$ which, as described above already, corresponds, at least approximately, to the inverse of the linear transfer function $H_1(p)$ of the transducer, or:

$$G_1(p)=\alpha/H_1(p), \tag{5}$$

$\alpha$ being a constant, for example equal to 1. The second circuit branch 15*b* compensates for the second order distortion produced by the transducer and has a transfer function $G_2(p_1, p_2)$, which is defined at least approximately by the equation:

$$G_2(p_1, p_2) = -\alpha H_2(p_1, p_2)/[H_1(p_1+p_2).H_1(p_2)] \quad (6)$$

The first and second order distortion components produced by the transducer 2 are compensated for with the aid of this network 3'.

Figure 3B:
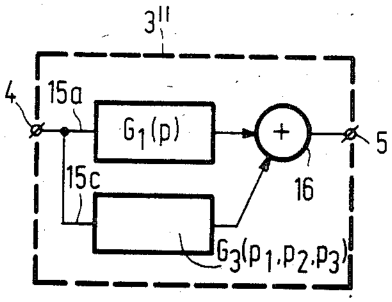

FIG. 3b shows a non-linear network 3'' comprising two circuit branches in parallel, which branches are connected in the same way as in FIG. 3a. One circuit branch 15a again compensates for the first order (or linear) distortion of the transducer 2. The other circuit branch 15c compensates for the third order distortion of the transducer and has a transfer function $G_3(p_1, p_2, p_3)$, which is defined, at least approximately, by the equation $$G_3(p_1, p_2, p_3) = -\alpha H_3(p_1, p_2, p_3)/[H_1(p_1).H_1(p_2)H_1(p_1+p_2+p_3)] \quad (7)$$

Figure 3C:
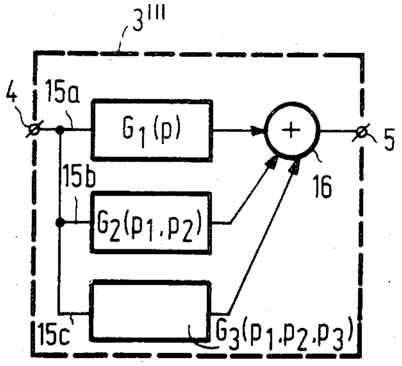

FIG. 3c shows a non-linear network 3''' compensating for the first order and both the second and third order distortion components produced by the transducer 2. To that end the network 3''' comprises three circuit branches 15a, 15b and 15c in parallel, which branches have the respective transfer functions $G_1(p)$, $G_2(p_1, p_2)$, and $G_3(p_1, p_2, p_3)$, as described already in the foregoing by means of the formulae (5), (6) and (7).

It will be obvious that the networks can all be extended by additional circuit branches for compensating for higher order distortion.

FIG. 4 shows three further examples 43', 43'' and 43''' of the non-linear network 3. These networks are arranged for reducing only the non-linear distortion by compensating for the second and/or higher order distortion components produced by the transducer 2.

Figure 4A:
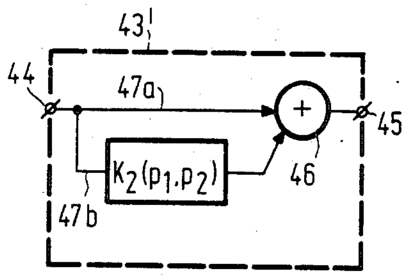
FIG. 4 illustrates by means of FIGS. 4*a*, 4*b* and 4*c* three possible further constructions for the non-linear network, intended to compensate only for non-linear distortion.

FIG. 4a shows a non-linear network 43' comprising two circuit branches 47a and 47b in parallel, which branches are coupled to the input 44 and whose outputs are coupled to the output 45 of the network 43' via a signal combining unit 46. One circuit branch 47a has a transfer function $K_1(p)$ equal to a constant $\alpha$. In all the examples of FIG. 4 $\alpha$ has been chose equal to unity. The second circuit branch 47b compensates for the second order component of the non-linear distortion produced by the transducer 2. To that end the circuit branch 47b has a transfer function $K_2(p_1, p_2)$ which, when the arrangement is included in the arrangement shown in FIG. 1a, is different—more specifically $KL_2(p_1, p_2)$—from when it is included in the arrangement shown in FIG. 1b—namely $Km_2(p_1, p_2)$.

$KL_2(p_1, p_2)$ and $Km_2(p_1, p_2)$, respectively are defined, at least approximately, by the following equations:

$$KL_2(p_1, p_2) = -H_2(p_1, p_2)/H_1(p_1+p_2)$$

$$Km_2(p_1, p_2) = -H_2(p_1, p_2)/H_1(p_1).H_1(p_2)$$

These formulae correspond to the formulae (12b) and (12c), $\alpha$ again being chosen equal to unity. So with the aid of network 43' only the second order distortion produced by the loudspeaker—the formula for $KL_2(p_1, p_2)$—and the second order distortion produced by the microphone—the formulae for $Km_2(p_1, p_2)$—are compensated for.

Figure 4B:
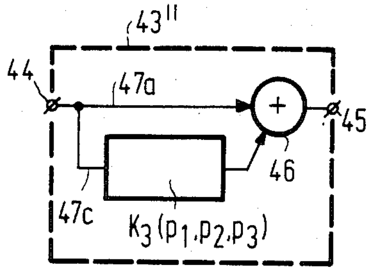

FIG. 4b shows a non-linear network 43'' comprising circuit branches in parallel, which branches are arranged similarly to those of FIG. 4a. The circuit branch

47c has a transfer function $K_3(p_1, p_2, p_3)$ which is different when it is included in the arrangement shown in FIG. 1a—more specifically $KL_3(p_1, p_2, p_3)$—than when it is included in the arrangement shown in FIG. 1b—namely $Km_3(p_1, p_2, p_3)$.

$KL_3(p_1, p_2, p_3)$ and $Km_3(p_1, p_2, p_3)$ are defined, at least approximately, by the equations:

$$KL_3(p_1, p_2, p_3) = -H_3(p_1, p_2, p_3)/H_1(p_1+p_2+p_3)$$

$$Km_3(p_1, p_2, p_3) = -H_3(p_1, p_2, p_3)/H_1(p_1).H_1(p_2).H_1(p_3)$$

These formulae correspond to the formulae (13b) and (13c), $\alpha$ again having been chosen equal to unity. So with the aid of network 43'' only the third order distortion produced by the loudspeaker—the formula $KL_3(p_1, p_2, p_3)$—and also that produced by the microphone—the formula $Km_3(p_1, p_2, p_3)$—is compensated for.

Figure 4C:
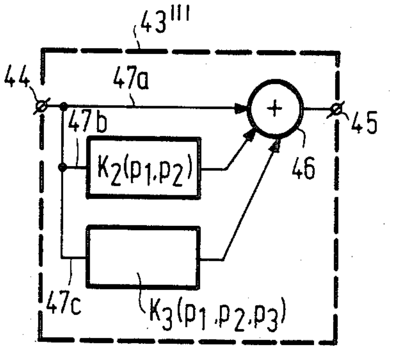

FIG. 4c shows a non-linear network 43''' which compensates for both the second and third order distortion produced by the transducer 2. To that end the network comprises three circuit branches 47a, 47b and 47c in parallel, which branches have the respective transfer functions $K_1(p)$, $KL_2(p_1, p_2)$ and $KL_3(p_1, p_2, p_3)$ for the suppression of non-linear distortion produced by a loudspeaker, and the respective transfer functions $K_1(p)$, $Km_2(p_1, p_2)$ and $Km_3(p_1, p_2, p_3)$ for suppressing the non-linear distortion produced by a microphone.

Figure 5:
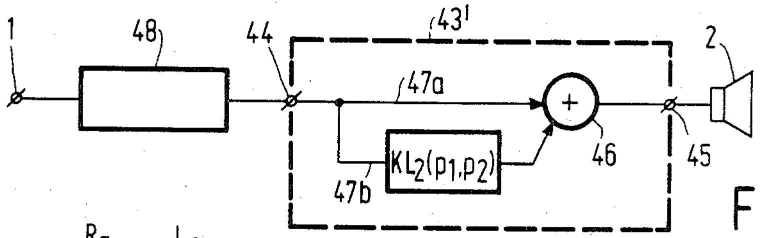
FIG. 5 shows a different arrangement according to the invention.

Also here it holds that the networks can be extended by including additional circuit branches for compensating for higher order non-linear distortion. The arrangement of FIG. 1a comprising a non-linear network in the form of the network 43' of FIG. 4a is also shown in FIG. 5.

If only the linear distortion and the second order non-linear distortion produced by the transducer is considered then the arrangement realizes from the input 44 of the network 43' to the output of the transducer 2 (the acoustic output signal of the converter) a total transfer function equal to $H_1(p)$ because the network 43' compensates for the non-linear distortion of the second order. So the linear distortion is still present. Now it is still possible to compensate for the linear distortion by arranging an additional network 48 having a transfer function at least approximately equal to $1/H_1(p)$ in the signal path to the transducer 2. The total transfer function of the arrangement now becomes equal to 1, that is to say the arrangement becomes free from first and second order distortion.

It is of course possible to realize the same in the arrangement shown in FIG. 1b by arranging the additional network 48 in the signal path from the microphone.

Now it will be described how the transfer functions $G_1(p)$, $G_2(p_1, p_2)$, $G_3(p_1, p_2, p_3)$, . . . $KL_2(p_1, p_2)$, $KL_3(p_1, p_2, p_3)$, . . . $Km_2(p_1, p_2)$, $Km_3(p_1, p_2, p_3)$, . . . can be derived.

A first possibility, which follows directly from the formulae (5), (6), (7), (12a), (13a), (12c) and (13c), is to perform measurements on the transducer 2 and to derive in this way the transfer functions $H_1(p)$, $H_2(p_1, p_2)$, $H_3(p_1, p_2, p_3)$, . . . and to derive thereafter the relevant transfer functions from the above-mentioned formulae.

Figure 6:
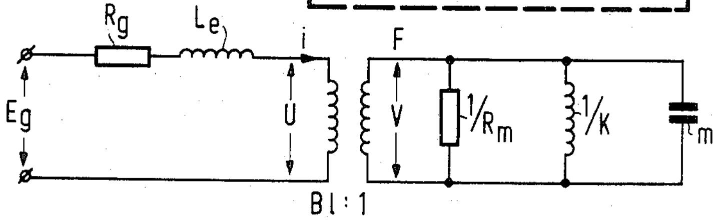
FIG. 6 is an equivalent circuit diagram of the mobility type of an electrodynamic transducer.

A different possibility is to describe the most important non-linearities of a transducer in a model and to determine the transfer function starting therefrom. This last mentioned method will be explained with reference to the following calculation, which is applied to a transducer in the form of an electrodynamic loudspeaker. The basis is the arrangement shown in FIG. 5 (without the additional network 48), only the second order component being compensated for in the network 43'. For low frequencies the behaviour of an electrodynamic loudspeaker can be represented by the electric equivalent circuit of the mobility type shown in FIG. 6 (see L. L. Beranek, "Acoustics", FIG. 3.43). The acoustic section is included in the mechanical parameters. The dominant non-linearities of a present-day electrodynamic loudspeaker are:

(a) A finite magnetic field as a result of which the power factor Bl becomes position-dependent:

$$Bl = Bl_o + Bl_1.u + Bl_2.u^2 \quad (16)$$

wherein B represents the magnetic induction in the air gap of the magnetic circuit and l represents the effective length of the voice-coil winding in the air gap, y being the excursion of the voice coil.

(b) a position-dependent inductance $L_e$ of the voice coil:

$$L_e = L_{eo} + L_{e1}.u + L_{e2}.u^2 \quad (17)$$

(c) a non-linear mechanical spring formed by the suspension:

$$k = k_o + k_1.u + k_2.u^2 \quad (18)$$

The coefficients $Bl_o$, $Bl_1$ etc. can be determined empirically. Starting from these relations and the fundamental relations of the linear model:

$$F = Bl.i$$

$$U = Bl.v \quad (20)$$

$$-E_g + i.R_e + (d/dt)(L_e.i) + U = 0 \quad (21)$$

$$F = m.a + R_m.v + k.u \quad (22)$$

$$v = du/dt,\ a = dv/dt \quad (23)$$

and disregarding the reluctance force $$F = -\tfrac{1}{2}\, i^2 \frac{dL_e(u)}{du}$$

we find that:

$$E_g = \alpha \cdot u + \beta \cdot u + \gamma \cdot \ddot{u} + \delta \cdot \dddot{u} + \quad (24)$$

$$C_1 \cdot E_g \cdot u + C_2 u^2 + C_3 u\dot{u} + C_4 \dot{u}\dot{u} + C_5 \dot{u}\ddot{u} + C_6 \dot{u}^2 + C_7 \ddot{u}\dot{u} +$$

$$D_1 \cdot E_g \cdot u^2 + D_2 u^3 + D_3 u^2 u + D_4 u^2 \ddot{u} + D_5 u^2 \dddot{u} + D_6 u\dot{u}^2 + D_7 \ddot{u}\dot{u}u,$$

Each dot on the parameter u indicates a differentiation with respect to time.

The constants $\alpha$, $\beta$, . . . $C_1$, $C_2$, . . . , $D_1$, $D_2$, . . . can be expressed in terms of the loudspeaker parameters.

$$\alpha = k_o R_e / Bl_o$$

$$\beta = \{R_e.R_m + k_o L_{eo} + (Bl_o)^2\} / Bl_o$$

$$\gamma = (m.R_e + L_{eo}.R_m) / Bl_o$$

$$\delta = m.L_{eo} / Bl_o$$

$$C_1 = -2Bl_1 / Bl_o$$

$$C_2 = (k_1 R_e Bl_o + Bl_1.k_o R_e)/(Bl_o)^2$$

$$C_3 = \{(Bl_1.R_e.R_m + 2L_{e1}.k_o.Bl_o + 2.k_{1}.{}_{eo}.Bl_o + 3.Bl_1.(Bl_o)^2\}/(Bl_o)^2$$

$$C_4 = (Bl_1.m.R_e + Bl_1.L_{eo}.R_m + L_{e1}.R_m.Bl_o)/(Bl_o)^2$$

$$C_5 = (Bl_1.m.L_{eo} + L_{e1}.m.Bl_o)/(Bl_o)^2$$

$$C_6 = (L_{e1}.R_m.Bl_o - Bl_1.L_{eo}.R_m)/(Bl_o)^2$$

$$C_7 = (L_{e1}.m.Bl_o - Bl_1.\mathrm{m}.\mathrm{L}_{eo})/(Bl_o)^2$$

$$D_1 = -(2.Bl_2.Bl_o + (Bl_1)^2)/(Bl_o)^2$$

$$D_2 = (k_2.R_e Bl_o + Bl_2.k_o.R_e + Bl_1.k_1.R_e)/(Bl_o)^2$$

$$D_3 = (Bl_2 \cdot R_e \cdot R_m - Bl_2 \cdot k_o \cdot L_{eo} + 3 \cdot L_{e2} \cdot k_o \cdot Bl_o + 3 \cdot k_2 \cdot L_{eo} \cdot Bl_o + 3 \cdot Bl_2 \cdot (Bl_o)^2 + Bl_1 \cdot L_{e1} \cdot k_o + 3 \cdot k_1 \cdot L_{e1} \cdot Bl_o + Bl_1 \cdot k_1 \cdot L_{eo} + 3 \cdot (Bl_1)^2 \cdot Bl_o)/(Bl_o)^2$$

$$D_4 = (Bl_2.m.R_e + Bl_2.L_{eo}.R_m + L_{e2}.R_m.Bl_o + Bl_1 L_{e1} R_m)/(Bl_o)^2$$

$$D_5 = (Bl_2.m.L_{eo} + L_{e2}.m.Bl_o + Bl_1.L_{e1}.m)/(Bl_o)^2$$

$$D_6 = (2.L_{e2}.R_m.Bl_o - 2.Bl_2.L_{eo}.R_m)/(Bl_o)^2$$

$$D_7 = (2.L_{e2}.m.Bl_o - 2.Bl_2.m.L_{eo})/(Bl_o)^2$$

If a signal $E_g$ equal to exp $[p_1.t]$ + exp $[p_2.t]$ is applied to the input and the third order term is disregarded, then a response of the form $$u(t) = q_1(p_1).\exp[p_1.t] + q_1(p_2).\exp[p_2.t] + q_2(p_1, p_2).\exp[(p_1+p_2)t] \quad (25)$$

is found, wherein $$q_1(p_1) = 1/(\alpha + \beta p_1 + \gamma p_1 2 + \delta p_1 3) \quad (26)$$

is the transfer function of the loudspeaker from an input voltage to the excursion of the diaphragm and $$H_1(p_1) = p_1 2.q_1(p_L)$$

is the transfer function of the loudspeaker from the input voltage to the acceleration of the diaphragm.

$$q_2(p_1,p_2) = -q_1(p_1+p_2) \cdot q_1(p_1) \cdot q_1(p_2) \cdot \{2(C_1 \cdot \alpha + C_2) + (C_1 \cdot \beta + C_3)(p_1+p_2) + C_1 \cdot \gamma + C_4)(p_1+p_2)^2 + (C_1 \cdot \delta + C_5)(p_1+p_2)^3 + -p_1 \cdot p_2[2(C_1 \cdot \gamma + C_4) - 2c_6 + (3(C_1 \cdot \delta + C_5) - C_7)(p_1+p_2]\} \quad (28)$$

Formula (25) clearly shows the behaviour of the second order system. As a response to the input signal which is made up from two sinusoidal components having frequencies $p_1$ and $p_2$ a signal is obtained made up from a sinusoidal component having the frequency $p_1$, a similar component with frequency $p_2$ and a second order intermodulation product having the frequency $\beta_1+\beta_2$. If $p_1=p_2$ then it can be seen that the third term of formula (25) describes the second harmonic distortion. Generally, this term therefore describes the second order intermodulation distortion. The first two terms in formula (25) describe the linear distortion. In response to two sinusoidal input signals having frequencies $p_1$ and $p_2$ and amplitude 1 two sinusoidal output signals occur which have frequencies $p_1$ and $p_2$, respectively, and amplitude $q_1(p_1)$ and $q_1(p_2)$, respectively. Generally, these amplitudes will not be equal to each other. The response to an input signal having a flat frequency characteristic consequently results in an output signal having a non-flat frequency response characteristic, that is to say the loudspeaker introduces linear distortion.

As the sound pressure level is proportional to the acceleration ($a=(d^2u/dt^2)$) and as $H_2(p_1, p_2)=H_2(p_2, p_1)$ it follows that $$H_2(p_1, p_2)=(p_1+p_2)^2 \cdot q_2(p_1, p_2)/2 \qquad (29)$$

Applying formula (12) to (27) and (29) then results in $$\begin{aligned} KL_2(p_1, p_2) &= -[(p_1+p_2)^2 \cdot q_2(p_1,p_2)/2]/[p_1+p_2)^2 \cdot q_1(p_1+p_2)] \qquad (30) \\ &= -q_2(p_1,p_2)/[2 \cdot q_1(p_1+p_2)] \\ &= q_1(p_1) \cdot q_1(p_2)\{2(C_1\alpha + C_2) + (C_1\beta + C_3)(p_1+p_2) + \\ & (C_1\gamma + C_4)(p_1+p_2)^2 + (C_1\delta + C_5)(p_1+p_2)^3 + \\ & -p \cdot p_2[2(C_1\gamma + C_4) - 2C_6 + (3(C_1\delta + C_5) - C_7)(p_1+p_2)]\} \end{aligned}$$

Figure 7:
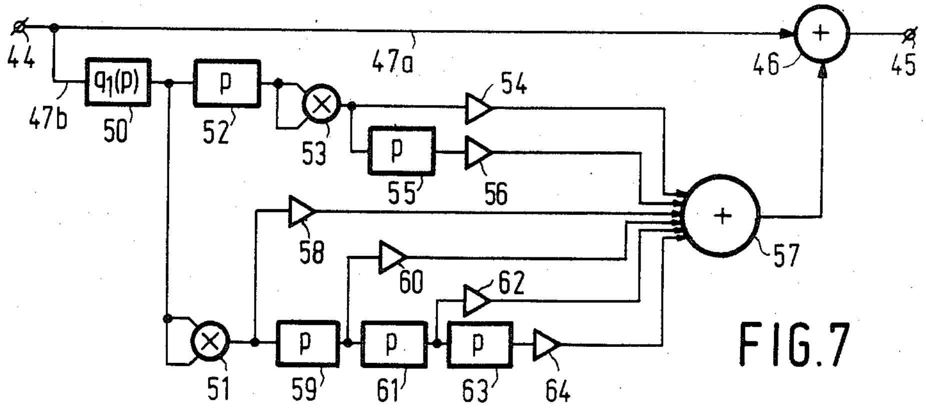
FIG. 7 shows a construction for the non-linear network for compensating only for second order distortion produced by a voltage-controlled loudspeaker.

FIG. 7 shows the network 43', a transfer function $KL_2(p_1, p_2)$ in accordance with formula (30) being realized in the circuit branch 47*b*. To that end this circuit branch comprises a first circuit 50 having a transfer function $q_1(p)$ at least approximately equal to the transfer function of the loudspeaker from the input voltage to the excursion of the diaphragm of the transducer, an output of which circuit is coupled to an input of a first squaring circuit 51 and also via a first differentiating network 52 to an input of a second squaring circuit 53. The output of the second squaring circuit 53 is coupled on the one hand via a first amplifier stage 54 and on the other hand via a second differentiating element 55 and a second amplifier stage 56 to respective first and second inputs of a signal combining unit 57. An output of the first squaring circuit 51 is coupled to a third input of the signal combining unit 57 via a third amplifier stage 58 and is also coupled to the input of a third differentiating element 59 the output of which is coupled to a fourth input of the signal combining unit 57 via a fourth amplifier stage 60 and also coupled to an input of a fourth differentiating element 61.

An output of the differentiating element 61 is coupled to a fifth input of the signal combining unit 57 via a fifth amplifier stage 62, and is also coupled to a sixth input of the signal combining unit 57 via a fifth differentiating element 63 and a sixth amplifier stage 64. The output of the signal combining unit 57 (being an adder) is coupled to an input of the signal combining unit (adder) 46.

To realize the transfer function defined by formula (30) the gain factors $V_1$ to $V_6$ of the first to sixth amplifier stages 54, 56, 58, 60, 62 and 64 must be chosen as follows:

$$V_1=-[2(C_1\gamma+C_4)-C_6]$$

$$V_2=-[3(C_1\delta+C_5)-C_7]$$

$$V_3=C_1\alpha+C_2$$

$$V_4=C_1\beta+C_3$$

$$V_5=C_1\gamma+C_4$$

$$V_6=C_1\delta+C_5$$

The circuit shown in FIG. 7 can optionally be extended to an inversion of any order, for example to realize the network shown in FIG. 4*c*. Then the complexity of the relations ultimately obtained and hence also of the ultimate circuit increases. Alternatively, a circuit as shown in FIG. 7 can be realized which is suitable for suppressing second order distortion produced by an electrodynamic microphone.

Figure 8:
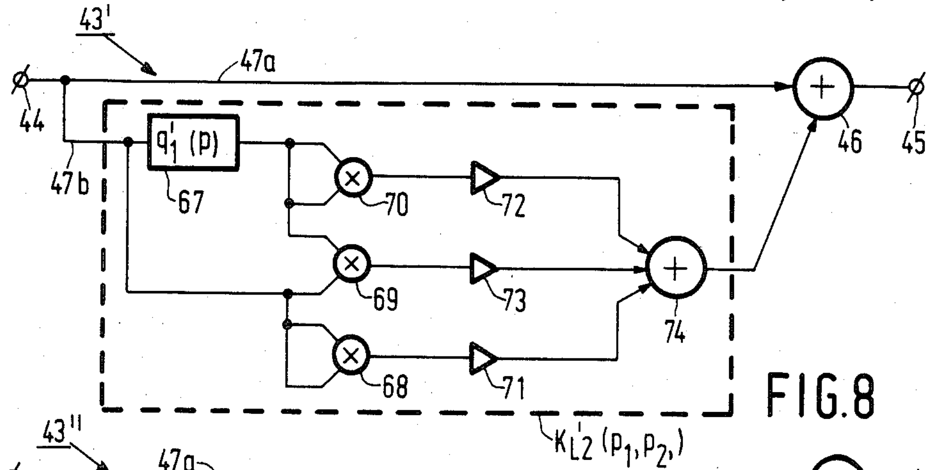
FIG. 8 shows a different construction for the non-linear network of FIG. 4*a* for compensating for second order distortion produced by a current-controlled loudspeaker.

FIG. 8 shows the network 43' of FIG. 5 for compensating for the non-linear distortion produced by a current controlled loudspeaker. As an additional dominant linearity there is added to the non-linearities mentioned in the foregoing and described with reference to the formulae (16) to (18)

(d) the reluctance force $F_r$ caused by the fact that the inductance of the voice-coil depends on its position. It holds that $$F_r = -\tfrac{1}{2} i^2 \frac{dL_e(u)}{du} \qquad (31)$$

The differential equation (22) which defines the mechanical behaviour of the loudspeaker for low frequencies now becomes:

$$Bli = m \cdot \frac{d^2u}{dt2} + R_m \frac{du}{dt} + k.i + F_r \qquad (32)$$

Herein use is made of formulae (19) and (23).

The non-linear transfer function is obtained by substituting $$i=e^{p_1t}+e^{p_2t}+e^{p_3t} \qquad (33)$$

in formula (32) and by assuming $$\begin{aligned} u(t) = {} & q_1'(p_1)e^{p_1t} + q_1'(p_2)e^{p_2t} + q_1'(p_3)e^{p_3t} + \qquad (34) \\ & q_2'(p_1,p_2)e^{(p_1+p_2)t} + q_2'(p_1,p_3)e^{(p+p_3)t} + \\ & q_2'(p_2 \cdot p_3)e^{(p_2+p_3)t} + q_3'(p_1,p_2,p_3)e^{(p_1+p_2+p_3)t} + \ldots \end{aligned}$$

as a solution.

Formulae (33) and (34) also include the third order term. These formulae describe the behaviour of a third order system. In response to an input signal assembled from three sinusoidal components having frequencies $p_1$, $p_2$ and $p_3$, a signal is produced which is assembled from sinusoidal components having the frequencies $p_1$, $p_2$ and $p_3$ (these components again define the linear distortion), sinusoidal components having the frequencies $p_1+p_2$, $p_1+p_3$ and $p_2+p_3$ (these components define the second order distortion) and a plurality of components having inter alia the frequency $p_1+p_2+p_3$ (the component having this frequency defines the third order distortion).

For $q_1'(p)$, $q_2'(p_1, p_2)$ and $q_3'(p_1, p_2, p_3)$: it is now found that:

$$q_1'(p) = \frac{Bl_o}{p^2m + p^Rm + k_o} \qquad (35)$$

-continued $$q_2'(p_1,p_2) = \frac{Bl_1\{q_1'(p_1)/(q_1'(p_2)\} - 2k_1q_1'(p_1)q_1'(p_2) + L_{e2}}{(p_1+p_2)^2m + (p_1+p_2)R_m + k_o} \quad (36)$$

and $$q_3'(p_1,p_2,p_3) = \frac{Bl_1A_1 + 2Bl_2A_2 - 2k_1A_3 - 2k_2A_4 + 2Le_2A_5}{(p_1+p_2+p_3)^2m + (p_1+p_2+p_3)R_m + k_o} \quad (37)$$

wherein the terms $A_1$ to $A_5$ can be derived as follows, using the quatities $q_1'(p)$ and $q_2'(p_1, p_2)$, in the loudspeaker parameters:

$$A_1 = q_2'(p_1, p_2) + q_2'(p_1, p_3) + q_2'(p_2, p_3)$$

$$A_2 = q_1'(p_1)q_1'(p_2) + q_1'(p_1)q_1'(p_3) + q_1'(p_2)q_1'(p_3)$$

$$A_3 = q_1'(p_1)q_2'(p_2, p_3) + q_1'(p_2)q_2'(p_1, p_3) + q_1'(p_3)q_2'(p_1, p_2)$$

$$A_4 = q_1'(p_1)q_1'(p_2)q_1'(p_3)$$

$$A_5 = q_1'(p_1) + q_1'(p_2) + q_1'(p_3) \quad (38)$$

It should here be noted that the quantities $q_1'(p)$ and $q_2'(p_1, p_2)$ defined by formulae (35) and (36) have dimensions which are different from those of the quantities $q_1(p)$ and $q_2(p1, p2)$ defined by formula (26) and (28), respectively. The dimension of $q_1'(p)$ is the "excursion" (of the voice coil) divided by "current" (through the voice coil).

The distortion-reducing non-linear network 43' of FIG. 8 can now be derived as follows. Of course it holds again that $k_1(p)=1$. The linear distortion is not compensated for. The circuit branch 47a is consequently again a through-connection. From formula (12a) it follows, using the formulae (27)—$H_1(p)$ here has again the dimension of the "acceleration" (of the voice coil) divided by "current"— and (29), that $$K_{L2}'(p_1, p_2) = -\tfrac{1}{2}\frac{q_2'(p_1,p_2)}{q_1'(p_1+p_2)},$$

or utilizing the formulae (35) and (36):

$$K_{L2}'(p_1, p_2) = -\frac{1}{2Bl_o}[Bl_1\{q_1'(p_1) + q_1'(p_2)\} - 2k_1q_1'(p_1)q_1'(p_2) + L_{e1}] \quad (39)$$

The network 43' in FIG. 8 is based on $k_1(p)=1$ and on formula (39) and comprises in the second branch 47b a first circuit 67 having a transfer function which is at least approximately equal to the transfer function of the input current of the transducer to the excursion of the transducer diaphragm. The input of the circuit 67 is coupled to an input of a first squaring circuit 68 and to a first input of a multiplier 69. The output of circuit 67 is coupled to a second input of multiplier 69 and to the input of a second and squaring circuit 70. The outputs of squaring circuits 68 and 70 of the multiplier 69 are coupled via associated first, second and third amplifier stages 71, 72, 73 to respective first, second and third inputs of a signal combining unit 74. The gain factors $V_1$, $V_2$ and $V_3$ of the amplifier stages 71, 72 and 73 are defined by:

$$V_1 = -\frac{Le_1}{2Bl_o}$$

$$V_2 = \frac{k_1}{Bl_o}$$

$$V_3 = -\frac{Bl_1}{Bl_o}$$

Figure 9:
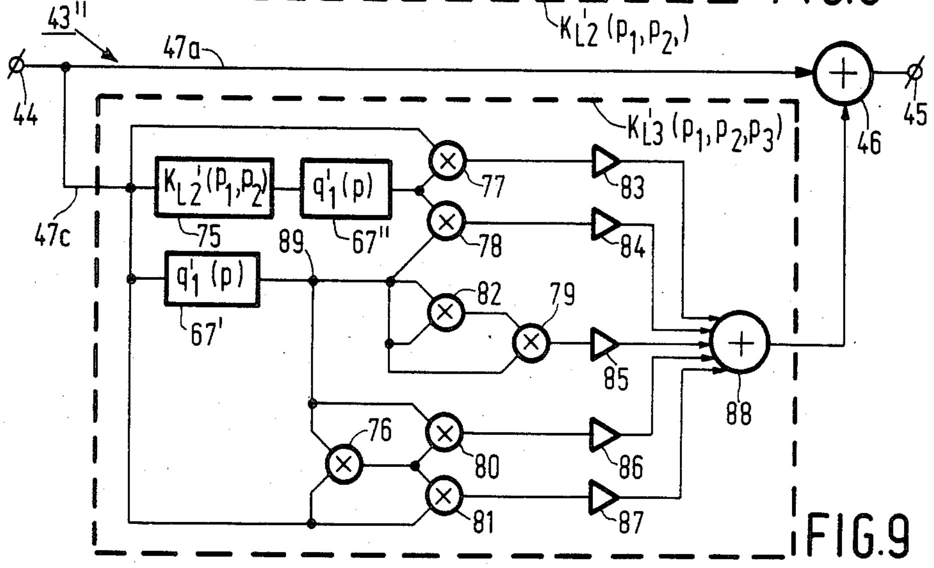
FIG. 9 shows a different construction for the non-linear network of FIG. 4*b* for compensating for only the third order distortion produced by this loudspeaker.

FIG. 9 shows the network 43" of FIG. 4b, with which the third order distortion component produced by a loudspeaker can be suppressed. To that end, a formula must first be derived for $K_{L3}'(p_1, p_2, p_3)$ starting from the formulae (13b), (35) (36) and (37).

For the third order transfer function $H_3(p_1, p_2, p_3)$ it holds that $$H_3(p_1, p_2, p_3) = \frac{1}{6}(p_1+p_2+p_3)^2q_3'(p_1, p_2, p_3) \quad (40)$$

We now find that $$K_{L3}'(p_1, p_2, p_3) = \frac{q_3'(p_1, p_2, p_3)}{6q_1'(p_1+p_2+p_3)}, \text{ or} \quad (41)$$

$$K_{L3}'(p_1,p_2,p_3) = -\frac{1}{6Bl_o}[Bl_1A_1 + 2Bl_2A_2 - 2k_1A_3 - 6k_2A_4 + 2Le_2A_5]$$

$A_1$ to $A_5$ are defined in formula (38).

FIG. 9 describes the arrangement shown in FIG. 4b, with the transfer function $K_{L3}'(p_1, p_2, p_3)$, based on formula (41). The terminal 44 is coupled to the inputs of the first circuits 67' and 67", which are both identical to the circuit 67 of FIG. 8, and a second circuit 75. This second circuit 75 provides the transfer function $K_{L2}'(p_1, p_2)$, being that portion of FIG. 8 that is framed-in by a broken line. The terminal 44 is further coupled to first inputs of the multipliers 76, 77 and 81. The circuit 75 is coupled to inputs of the multipliers 77 and 78 via the circuit 67". The circuit 67' is coupled to an input of the multipliers 76, 79 and 80 and to an input of a squaring circuit 82. The output of squaring circuit 82 is coupled to an input of the multiplier 79. The ouput of the multipliers 77 to 81 are coupled to inputs of a signal combining unit 88 via amplifier stages 83 to 87. The gain factors $V_1$ to $V_5$ of the amplifier stages 81 to 87 are defined by $$V_1 = -\frac{Bl_1}{Bl_o}$$

$$V_2 = \frac{k_1}{Bl_o}$$

$$V_3 = \frac{k_2}{Bl_o}$$

$$V_4 = \frac{-Bl_2}{Bl_o}$$

$$V_5 = -\frac{Le_2}{Bl_o}$$

It will be obvious that simplifications in $K_{L3}'(p_1, p_2, p_3)$ are possible. If the circuit 75 is structured in accordance with $K_{L2}'(p_1, p_2)$ of FIG. 8, then it will be obvious that circuit 67' can be omitted and that point 89 must then be coupled to the output of circuit 67 of FIG. 8. When FIGS. 8 and 9 are combined to provide an arrangement as shown in FIG. 4c then the circuits 67' and 75 of FIG. 9 can both be omitted. Then the point 89 is coupled to the output of circuit 67 of circuit branch 47b and the input of circuit 67'' is coupled to the output of the signal combining unit 74 of FIG. 8.

Figure 10:
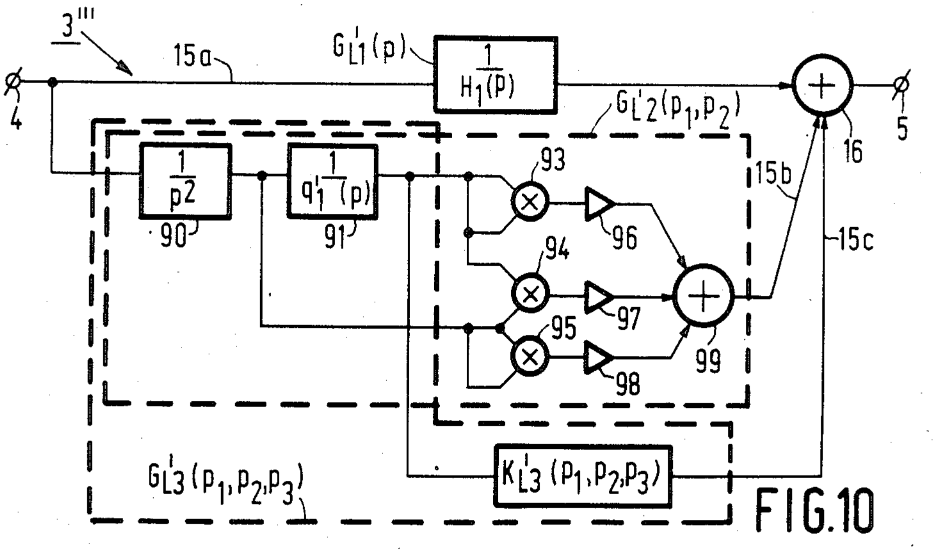
FIG. 10 shows a construction for compensating for the first order (i.e. linear) distortions, the second order and the third (non-linear) distortion produced by a current-controlled loudspeaker.

FIG. 10 shows a construction of a non-linear network as shown in FIG. 3c for reducing both linear and non-linear distortion produced by a loudspeaker which is driven by current.

From the formulae (5), (27) and (35) it follows that $$G_{L1}'(p) = \frac{p^2 m + pR_m + k_o}{p^2 Bl_o} \qquad (42)$$

From the formulae (6), (27) and (29) it follows that $$G_{L2}'(p_1, p_2) = \frac{H_2(p_1, p_2)}{H_1(p_1)H_1(p_2)H_1(p_1 + p_2)} = -\frac{q_2'(p_1, p_2)}{2p_1^2 p_2^2 q_1^3(p_1)q_1'(p_2)q_1'(p_1 + p_2)}$$

Utilizing formulae (35) and (36) this results in that $$G_{L2}'(p_1, p_2) = -\frac{1}{2Bl_o}\left[Bl_1 \frac{1}{(p_1, p_2)^2}\left\{\frac{1}{q_1'(p_1)} + \frac{1}{q_1'(p_2)}\right\} - \frac{2k_1}{(p, p_2)^2} + \frac{Le_1}{(P_1 p_2)^2 q_1'(p_1) q_2'(p_2)}\right] \qquad (43)$$

Similarly, using formulae (7), (27), (29) and (35) to (37) it is found that:

$$G_{L3}'(p_1, p_2, p_3) = -\frac{1}{6Bl_o}\left[\frac{Bl_1 A_1 + 2Bl_2 A_2 - 2k_1 A_3 - 6k_2 A_4 + 2Le_2 A_5}{(p_1 \cdot p_2 \cdot p_3)^2 q_1(p_1) q_1(p_2) q_1(p_3)}\right] \qquad (44)$$

$A_1$ to $A_5$ are also here defined by formula (38).

FIG. 10 shows in the circuit branch 15a the transfer function $G_{L2}'(p_1, p_2)$ which is defined by formula (42). The circuit branch 15b comprises the transfer function $G_{L2}'(p_1, p_2)$ which is constituted by an integrating element 90, whose output is coupled to an input of a first circuit 91 having a transfer function equal to $1/q_1'(p)$, where $q_2'(p)$ is again defined by formula (35), and is also coupled to an input of a first squaring circuit 95 and a first input of a multiplier 94. In addition, the output of circuit 91 is coupled to an input of a second squaring circuit 93 and to a second input of the multiplier 94. The outputs of the elements 93, 94 and 95 are coupled via amplifier stages 96, 97 and 98 to respective inputs of a signal combining unit 99, an output of which is coupled to an input of the signal combining unit 16. The amplifier stages 96, 97 and 98 have gain factors $V_1$, $V_2$ and $V_3$ which are defined by the following equations:

$$V_1 = -\frac{Le_1}{2Bl_o}$$

-continued $$V_2 = -\frac{Bl_1}{Bl_o}$$

$$V_3 = \frac{k_1}{Bl_o}$$

The circuit branch 15c also comprises the elements 90 and 91 and in addition the circuit $K_{L3}'(p_1, p_2, p_3)$, which circuit is shown in FIG. 9.

It should be noted that the invention is not limited to the embodiments described. The invention is equally suitable for use in arrangements of a type which differ from the embodiments show in respects which are irrelevant to the inventive idea as defined by the claims. Thus, arrangements are possible in which the transducer is of a type other than the electrodynamic type, so for example of the electrostatic type.

Literature

M. Schetzen, The Volterra and Wiener Theories of nonlinear Systems, Wiley 1980.

H. J. Butterweck, Frequenzabhängige nichtlineare Uebertragungssysteme, Archiv El. Uebertr. 21. Vol. 5, May 1967.

L., Beranek, Acoustics, McGraw-Hill 1954.

Bruel and Kjaer, Application note 15-098, "Swept measurements of harmonic, difference frequency and intermodulation distortion".

What is claimed is:

1. An arrangement having a transducer for converting electrical energy into acoustic energy or which converts acoustic energy into an electrical signal, said transducer producing further linear and higher order non-linear distortion products during conversion of one form of energy to another, a first circuit branch comprising a non-linear network connected to said transducer which compensates for at least one second or higher order distortion component contained in said non-linear distortion products, whereby the total distortion products are reduced, defined by the equation $$G_2(p_1, p_2) = -\alpha H_2(p_1, p_2)/[H_1(p_1 + p_2).H_1(p_1).H_1(p_2)],$$

wherein $H_2(p_1, p_2)$ is the Laplace transform of $h_2(t_1, t_2)$, being the second order response of the transducer to an input signal applied to the transducer, which signal is made up from two pulses which are time-shifted relative to each other, and a second circuit branch compensating for a first order distortion and having a transfer function $G_1(p)$ at least approximately corresponding to the inverse of the linear transfer function $H_1(p)$ of the transducer multiplied by a constant $\alpha$, where $G_1(p) = \alpha/H_1(p)$.

2. An arrangement as claimed in claim 1 wherein said transducer is a current controlled loudspeaker, and said first circuit branch for compensating for higher order distortion comprises:

- an integrating element having an output connected to a first circuit, said first circuit having a transfer characteristic which is the reciprocal of the transfer function of said loudspeaker defined by its current input versus said loudspeaker diaphragm excursion;
- a squaring circuit coupled to said integrating element output;

a multiplier having one input connected to said integrating element output and a second input connected to an output of said first circuit;

a second squaring circuit having an input coupled to an output of said first circuit;

first, second and third amplifier stages connected to said first squaring circuit, said second squaring circuit and said multiplier output; and, a combining unit connected to receive signals from said first, second and third amplifier stages, said combining unit producing a signal which compensates for second order distortion components produced by said current controlled loudspeaker.

3. An arrangement as claimed in claim 1 wherein the circuit branches are coupled to an output of the network by an additional signal combining unit.

4. An arrangement as claimed in claim 1, wherein $\alpha$ is equal to unity.

5. An arrangement having a transducer for converting electrical signal energy into acoustic energy or which converts acoustic energy into an electrical signal, said transducer producing further linear and higher order non-linear distortion products during conversion of one form of energy to another, a first circuit branch comprising a non-linear network connected to said transducer which compensates for the third order distortion component contained in said non-linear distortion products having a transfer function $G_3(p_1, p_2, p_3)$ defined by $$G_3(p_1, p_2, p_3) = -\alpha H_3(p_1, p_2, p_3)/[H_1(p_1).H_1(p_2).H_1(p_3).H_1(p_1+p_2+p_3)],$$

wherein $H_3(p_1, p_2, p_3)$ is the Laplace transform of $h_3(t_1, t_2, t_3)$, being the third order response of the transducer to an input signal applied to the transducer made up from three pulses which are time shifted in relation to each other, and $H_1(p)$ is the linear transfer function of the transducer, and a second circuit branch for reducing first order distortion and having a transfer function $G_1(p)$ at least approximately corresponding to the inverse of the linear transfer functions $H_1(p)$ of the transducer multiplied by a constant $\alpha$, where $G_1(p)=\alpha/H_1(p)$.

6. An arrangement having a transducer for converting electrical signal energy into acoustic energy or which converts acoustic energy into an electrical signal, said transducer producing further linear and higher order non-linear distortion products during conversion of one form of energy to another, a non-linear network connected to said transducer which compensates for at least one second or higher order distortion component contained in said non-linear distortion products, said network comprising a first circuit branch having a transfer function $K_1(p)$ which is equal to a constant $\alpha$, and a second circuit branch in parallel with said first branch having a transfer function $KL_2(p_1, p_2)$ defined by the equation $$KL_2(p_1, p_2) = -\alpha H_2(p_1, p_2)/H_1(p_1+p_2)$$

wherein $H_1(p)$ is the linear transfer function of the transducer and $H_2(p_1, p_2)$ is the Laplace transform of $h_2(t_1, t_2)$ being the second order response of the transducer to an input signal applied to the transducer made up from two pulses which are time shifted relative to each other.

7. An arrangement as claimed in claim 6, wherein the second circuit branch comprises a first circuit having a transfer function which is at least approximately equal to the transfer function representing the transducer input current excursion to the excursion of the transducer diaphragm, an input of said first circuit being coupled to an input of a first squaring circuit and to a first input of a multiplier, and an output of said first circuit being coupled to an input of a second squaring circuit and to a second input of the multiplier, the outputs of the first and second squaring circuits and of the multiplier being coupled by associated first, second and third amplifier stages to respective first, second and third inputs of a signal combining unit.

8. An arrangement as claimed in claim 6 wherein said second circuit branch comprises:

a first circuit having a transfer function at least approximately equal to the transfer function of the transducer representing the excursion of a diaphragm of said transducer versus an input voltage;

a first squaring circuit connected to an output of said first circuit;

a second squaring circuit connected through a first differentiating network to said first circuit output;

a signal combining unit for combining a plurality of signals;

a first amplifier stage connecting said second squaring circuit to said signal combining unit;

a second differentiating network and second amplifier stage connecting said second squaring circuit output to said signal combining unit;

a third amplifier stage connecting said first squaring circuit to said signal combining unit;

a third differentiating network and fourth amplifier connecting said first squaring circuit to said combining unit;

a fourth differentiating network connected to an output of said third differentiating network;

a fifth differentiating network connected to an output of said fourth differentiating network; and fifth and sixth amplifiers connecting an output of said fourth and fifth differentiating networks to said combining unit.

9. An arrangement as claimed in claim 6 further comprising in cascade with the transducer an additional network having a transfer function $T(p)$ at least approximately equal to the inverse of the linear transfer function $H_1(p)$ of the transducer, $T(p)=\beta/H_1(p)$, $\beta$ being a constant which is preferably equal to unity.

10. An arrangement having a transducer for converting electrical signal energy into acoustic energy or which converts acoustic energy into an electrical signal, said transducer producing further linear and higher order non-linear distortion products during conversion of one form of energy to another, a non-linear network connected to said transducer which compensates for at least a third order component of said distortion products, said network comprising a first circuit branch having a transfer function $K_1(p)$ which is equal to a constant $\alpha$, and a second circuit branch in parallel with said first circuit branch having a transfer function $KL_3(p_1, p_2, p_3)$ defined by the equation:

$$KL_3(p_1, p_2, p_3) = -\alpha H_3(p_1, p_2, p_3)/H_1(p_1+p_2+p_3)$$

wherein $H_3(p_1, p_2, p_3)$ is the Laplace transform of $h_3(t_1, t_2, t_3)$ which is the third order response of the transducer to an input signal comprising three pulses time shifted relative to each other applied to the transducer.

11. An arrangement having a transducer for converting electrical signal energy into acoustic energy or which converts acoustic energy into an electrical signal, said transducer producing further linear and higher order non-linear distortion products during conversion of one form of energy to another, a non-linear network connected to said transducer which compensates for a second order component of said distortion products, said network comprising a first circuit branch having a transfer function $K_1(p)$ which is equal to a constant $\alpha$, and a second circuit branch in parallel with said first circuit branch having a transfer function $KM_2(p_1, p_2)$ defined by $$KM_2(p_1, p_2) = -\alpha H_2(p_1, p_2)/H_1(p_2).H_1(p_2),$$

wherein $H_1(p)$ is the linear transfer function of the transducer and $H_2(p_1, p_2)$ is the Laplace transform of $h_2(t_1, t_2)$, the second order response of the transducer to an input signal of two pulses which are time shifted relative to each other applied to the transducer.

12. An arrangement having a transducer for converting electrical signal energy into acoustic energy or which converts acoustic energy into an electrical signal, said transducer producing further linear and higher order non-linear distortion products during conversion of one form of energy to another, a non-linear network connected to said transducer which compensates for a third order component of said distortion products, said network including a first circuit branch having a transfer function $K_1(p)$ which is equal to a constant $\alpha$, and a second circuit branch in parallel with said first circuit branch having a transfer function $KM_3(p_1, p_2, p_3)$ defined by $$KM_3(p_1, p_2, p_3) = -\alpha H_3(p_1, p_2, p_3)/H_1(p_1).H_1(p_2).H_1(p_3),$$

wherein $H_1(p)$ is the linear transfer function of the transducer and $H_3(p_1, p_2, p_3)$ is the Laplace transform of $h_3(t_1, t_2, t_3)$, which is the third order response of the transducer to three relatively time shifted pulses applied as an input signal to said transducer.

* * * * *